(12) United States Patent
Chang et al.

(10) Patent No.: US 7,171,536 B2
(45) Date of Patent: Jan. 30, 2007

(54) UNUSABLE BLOCK MANAGEMENT WITHIN A NON-VOLATILE MEMORY SYSTEM

(75) Inventors: Robert C. Chang, Danville, CA (US); Bahman Qawami, San Jose, CA (US); Farshid Sabet-Sharghi, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 446 days.

(21) Appl. No.: 10/682,641

(22) Filed: Oct. 9, 2003

(65) Prior Publication Data

US 2004/0080998 A1   Apr. 29, 2004

Related U.S. Application Data

(60) Provisional application No. 60/421,965, filed on Oct. 28, 2002.

(51) Int. Cl.
*G06F 12/00* (2006.01)

(52) U.S. Cl. .................. 711/170; 711/103; 711/156

(58) Field of Classification Search ............... 711/103, 711/170, 156; 365/185.09
See application file for complete search history.

(56) References Cited

U.S. PATENT DOCUMENTS

| 5,222,109 | A | 6/1993 | Pricer .................... 377/24.1 |
|---|---|---|---|
| 5,297,148 | A | 3/1994 | Harari et al. ............... 371/10.2 |
| 5,377,146 | A * | 12/1994 | Reddy et al. ............... 365/200 |
| 5,388,083 | A | 2/1995 | Assar et al. ................ 365/218 |
| 5,438,573 | A | 8/1995 | Mangan et al. ............ 371/10.3 |
| 5,568,439 | A | 10/1996 | Harari ........................ 365/218 |
| 5,598,370 | A | 1/1997 | Niijima et al. ......... 365/185.33 |
| 5,691,786 | A * | 11/1997 | Nakai ........................... 349/39 |
| 5,835,935 | A | 11/1998 | Estakhri et al. ............. 711/103 |
| 5,845,313 | A | 12/1998 | Estakhri et al. ............. 711/103 |
| 5,860,082 | A | 1/1999 | Smith et al. ................. 711/103 |
| 5,907,856 | A | 5/1999 | Estakhri et al. ............. 711/103 |
| 5,924,113 | A | 7/1999 | Estakhri et al. ............. 711/103 |
| 6,016,275 | A | 1/2000 | Han ..................... 365/185.29 |
| 6,081,447 | A | 6/2000 | Lofgren et al. ........ 365/185.02 |

(Continued)

FOREIGN PATENT DOCUMENTS

JP    62-283496    12/1987

(Continued)

OTHER PUBLICATIONS

Kim, Jesung et al., "A Space-Efficient Flash Translation Layer for Compactflash Systems", IEEE Transactions on Consumer Electronics, vol. 48, No. 2, May 2002.

*Primary Examiner*—Hiep T. Nguyen
(74) *Attorney, Agent, or Firm*—Anderson, Levine & Lintel

(57) ABSTRACT

Methods and apparatus for tracking defective blocks such that at least some of the defective blocks may be readily identified and tested for usability when desirable are disclosed. According to one aspect of the present invention, a method for identifying spare blocks within a non-volatile memory includes subjecting at least one defective physical block associated with the non-volatile memory to a test that is arranged to determine if the defective physical block is usable. The method also includes determining when the defective physical block passes the test, and identifying the defective physical block as a usable physical block when it is determined that the defective physical block passes the test.

51 Claims, 10 Drawing Sheets

U.S. PATENT DOCUMENTS

| | | | |
|---|---|---|---|
| 6,115,785 A | 9/2000 | Estakhri et al. | 711/103 |
| 6,125,435 A | 9/2000 | Estakhri et al. | 711/201 |
| 6,230,233 B1 | 5/2001 | Lofgren et al. | 711/103 |
| 6,260,156 B1 | 7/2001 | Garvin et al. | 714/8 |
| 6,381,176 B1 | 4/2002 | Kim et al. | 365/185.11 |
| 6,426,893 B1 | 7/2002 | Conley et al. | 365/185.11 |
| 6,563,732 B2 * | 5/2003 | Matarrese et al. | 365/185.09 |
| 6,759,257 B2 * | 7/2004 | McCormack et al. | 438/15 |

FOREIGN PATENT DOCUMENTS

| | | |
|---|---|---|
| JP | 62-283497 | 12/1987 |

* cited by examiner

UNUSABLE BLOCK MANAGEMENT WITHIN A NON-VOLATILE MEMORY SYSTEM

This patent application claims priority to U.S. Provisional Patent Application No. 60/421,965, filed Oct. 28, 2002, which is hereby incorporated by reference in its entirety.

CROSS REFERENCE TO RELATED APPLICATIONS

The present invention is related to co-pending U.S. patent application Ser. Nos. 10/281,739, 10/281,823, 10/281,670, 10/281,824, 10/281,631, 10/281,855, 10/281,762, 10/281,696, 10/281,626, and 10/281,804, as well as co-pending U.S. Provisional Patent Application Nos. 60/421,910, 60/421,725, 60/422,166, 60/421,746, and 60/421,911, each filed on Oct. 28, 2002, which are each incorporated herein by reference in their entireties.

BACKGROUND OF THE INVENTION

1. Field of Invention

The present invention relates generally to mass digital data storage systems. More particularly, the present invention relates to systems and methods for enabling defective or unusable physical blocks to be managed such that defective blocks with growing defects may possibly be reclaimed when spare blocks are needed.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

In general, flash memory storage systems may include flash memory cards and flash memory chip sets. Flash memory chip sets generally include flash memory components and a controller components. Typically, a flash memory chip set may be arranged to be assembled into an embedded system. The manufacturers of such assemblies or host systems typically acquire flash memory in component-form, as well as other components, then assemble the flash memory and the other components into a host system.

When a flash memory is manufactured, manufacturing or factory defects are typically identified by the manufacturer of the flash memory. In general, as long as a flash memory includes less than a certain number or a certain percentage of defective or unusable physical blocks, the flash memory may be sold, e.g., to a manufacturer of a flash memory card. The defective blocks may, for example, fail to hold electrical charges and fail stress tests applied by the manufacturer of the flash memory. When factory defects are identified, the manufacturer of the flash memory may effectively mark blocks which include factory defects as being defective.

Defective blocks in a flash memory which include factory defects may be identified using a scanning process when power is applied to the flash memory. In general, a scanning process also identifies defective blocks which include growing defects, or blocks which were once usable but have become unusable. While a scanning process identifies defective blocks, a scanning process generally does not differentiate between defective blocks with factory defects and defective blocks with growing defects. The identification of defective blocks is important to ensure the integrity of an overall flash memory system by preventing defective blocks from being used. By way of example, when a defective block which is not capable of holding data is used to store data, the data may be lost.

Typically, upon the application of power to the flash memory, a temporary or volatile list of the defective blocks may be created once the defective blocks are identified by a scanning process. With reference to FIG. 1, the steps associated with one conventional method of compiling a list of defective blocks within a memory system will be described. A process 200 of compiling a list of defective, or unusable, blocks begins at step 204 in which power is provided to the memory system. Once the memory system is powered up, substantially all blocks, i.e., physical blocks in a non-volatile memory of the memory system, are scanned in step 208 order to identify defective blocks. Typically, when a system is first powered up to be formatted, defective blocks include only blocks with factory defects, or defects which were first identified during a manufacturing process associated with the non-volatile memory. Upon subsequent power up processes, defective blocks may include both blocks with factory defects and blocks with growing defects, or defects which arise during the course of the memory system being used.

After defective blocks are identified, a list of the defective blocks may be created in a buffer in step 212. Often, the list is created in a volatile buffer associated with the memory system such that when power is removed from the memory system, the list is lost. Also, the list of defective blocks generally does not differentiate between blocks which are defective due to factory defects and blocks which are defective due to growing defects. Instead, the blocks in the list are only identified as generally being unusable.

In step 216, the defective or unusable blocks are prevented from being used. Preventing the defective blocks from being used may include making sure that blocks in the list of defective blocks are not accessed for use as spare blocks. As such, blocks which are not included in the list are used in step 220 for use in storing data or information. Occasionally, a block which is not included in the list of defective blocks may not be successfully read from, successfully written to, or successfully erased. In other words, a block which is not included in the list of defective blocks may be defective, as for example due to a growing defect which has arisen. Hence, from step 220, process flow proceeds to step 224 in which it is determined if the block which is not included in the list of defective blocks is, in fact, defective.

If it is determined in step 224 that the block is not defective, the process flow returns to step 220 in which blocks which are not included in the list continue to be used. Alternatively, if it is determined in step 224 that the block which is not included in the list is defective, then the block is added in step 228 to the list of defective blocks. Once the block is added to the list of defective blocks, process flow returns to step 220 in which blocks which are not included in the list of defective blocks are used.

Although the creation of a list of defective blocks is generally effective in preventing the defective blocks from being used, often, at least some of the blocks identified in the list may actually be usable. Specifically, at least some of the defective blocks which include growing defects may actually pass a testing process with a rigorous pattern, i.e., at least some of the defective blocks may actually be proven to be usable. In some cases, a block which appears to be defective in some "extreme" or rare environments may actually not be defective in the "normal" or more common environments. As a result, blocks which are actually usable may not be used, and the memory system may operate less efficiently as a result of an inability to use substantially all blocks which are usable. For example, if a NAND flash memory is subjected to an environment of approximately 90 degrees Celsius, which is generally out of the specification range of most flash memories, many growing defects are typically detected. Many of these unusable growing defects which are detected in the environment which is out of the specification range may be usable when the memory is brought back to a more normal temperature that is, for instance, within the range stated in the memory specification.

At times, during the course of using a memory system which includes a flash memory component, it may be determined that the memory system does not have enough spare blocks available for use in storing data. When there are not enough spare blocks available for use in storing data, it may be necessary for a user to obtain additional flash memory components for use in storing data. Obtaining additional flash memory components for use with the memory system may be time-consuming, as well as relatively expensive. When there may be usable blocks which have been characterized as being unusable, it may be particularly inefficient to compensate for a lack of available spare blocks within the memory system, as some potentially usable blocks are effectively being wasted.

Therefore, what is needed is a method and an apparatus which enables potentially usable blocks which are identified as defective blocks to be used as spare blocks. That is, what is desired is a method and an apparatus for "recycling" or reclaiming blocks which are characterized as being defective due to growing defects when such block are actually usable.

SUMMARY OF THE INVENTION

The present invention relates to a system and a method for tracking defective blocks such that at least some of the defective blocks may be readily identified and tested for usability when desirable. According to one aspect of the present invention, a method for identifying spare blocks within a non-volatile memory includes subjecting at least one defective physical block associated with the non-volatile memory to a test that is arranged to determine if the defective physical block is usable. The method also includes determining when the defective physical block passes the test, and identifying the defective physical block as a usable physical block when it is determined that the defective physical block passes the test. In one embodiment, identifying the defective physical block as a usable physical block includes identifying the defective physical block as a first spare block, and adding the first spare block to a pool of spare blocks associated with the non-volatile memory.

The ability to reclaim potentially usable blocks which have previously been identified as being unusable for use effectively enables substantially every available block within a non-volatile memory system to be used to store data, thereby enabling the memory system to be used and, hence, operate more efficiently. In one embodiment, blocks with growing defects, such as the inability to be successfully erased, which were once "good" but have become "bad," may potentially be reclaimed after rigorous testing. By enabling some blocks to be reclaimed, the resources of a memory system may be used more efficiently.

According to another aspect of the present invention, a method of managing unusable physical storage elements within a non-volatile memory includes determining when a first physical storage element is identified as being defective, and substantially removing the first physical storage element from a pool of usable physical storage elements when it is determined that the first physical storage element is identified as being defective. The method also includes storing a first signature into a data structure in the non-volatile memory that identifies the first physical storage element as being defective. Such a data structure may be an erase count block as described in U.S. patent application Ser. No. 10/281,626. In one embodiment, determining when the first physical storage element is defective includes at least one of determining when the first physical storage element may not be successfully read from, determining when the first physical storage element may not be successfully written to, and determining when the first physical storage element may not be successfully erased.

In accordance with still another aspect of the present invention, a method for managing blocks within a non-volatile memory system includes determining when a first physical block within a non-volatile memory of the non-volatile memory system has a factory defect, storing a first signature in a data structure associated with the non-volatile memory which identifies the first physical block as having the factory defect when it is determined that the first physical block has the factory defect. The method also includes substantially preventing the first physical block from being used to store information when it is determined that the first physical block has the factory defect, determining when a second physical block within the non-volatile memory has a growing defect and storing a second signature in the data structure which identifies the second physical block as having the growing defect when it is determined that the second physical block has the growing defect. Finally, the method includes substantially preventing the second physical block from being used to store information when it is determined that the first physical block has the growing defect.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIG. 2b is a diagrammatic representation a memory device, e.g., memory device 120 of FIG. 2a.

DETAILED DESCRIPTION OF THE EMBODIMENTS

When a memory system which includes a non-volatile memory has a pool of spare physical blocks which is being depleted, i.e., is running low, a user of the memory system may effectively be forced to compensate by the lack of available memory. For instance, a user may obtain additional non-volatile memory, which may be expensive. At times, physical blocks of a non-volatile memory which are identified as being unusable or defective in some environments may actually be suitable for use at a later time in a different environment. For example, physical blocks which have been identified as being unusable due to growing defects may, upon the implementation of a thorough testing process with a rigorous pattern, be reclaimable. When there may be usable blocks which have been characterized as being unusable, some potentially usable blocks are effectively being wasted.

By reclaiming potentially usable blocks which have previously been identified as being unusable for use, substantially every available block which is suitable for use may be used to store data, thereby enabling an overall memory system to be used and, hence, operate more efficiently. Typically, blocks with factory defects, such as an inability to maintain stored levels of charge, were defective at the time they were manufactured and will substantially always be defective and, hence, are not reclaimable. However, blocks with growing defects, such as the inability to be successfully erased, which were once "good" but have become "bad," may be reclaimed in some cases. As such, in one embodiment, blocks which have growing defects may be tested to determine if the blocks are actually usable, while blocks which have factory defects may not be tested.

Identifying whether unusable blocks are unusable due to factory defects or due to growing defects enables an overall block reclamation process to occur more efficiently, as the testing of blocks with factory defects may be avoided. In other words, by substantially only testing blocks which are potentially reclaimable, e.g., blocks with growing defects, the testing process to reclaim blocks may be efficiently implemented, as blocks which are not likely to be reclaimed are generally not tested. When unusable blocks are identified, marking the unusable blocks as either being unusable due to factory defects or unusable due to growing defects enables the unusable blocks with growing defects to be readily identified.

Managing unusable blocks by tracking whether unusable blocks include factory defects or growing defects allows the resources of a memory system to be used efficiently. When there is the potential to reclaim at least some unusable blocks within a non-volatile memory which have growing defects, it may be possible to at least delay the need to replace the non-volatile memory due to a lack of available blocks.

Figure 1:
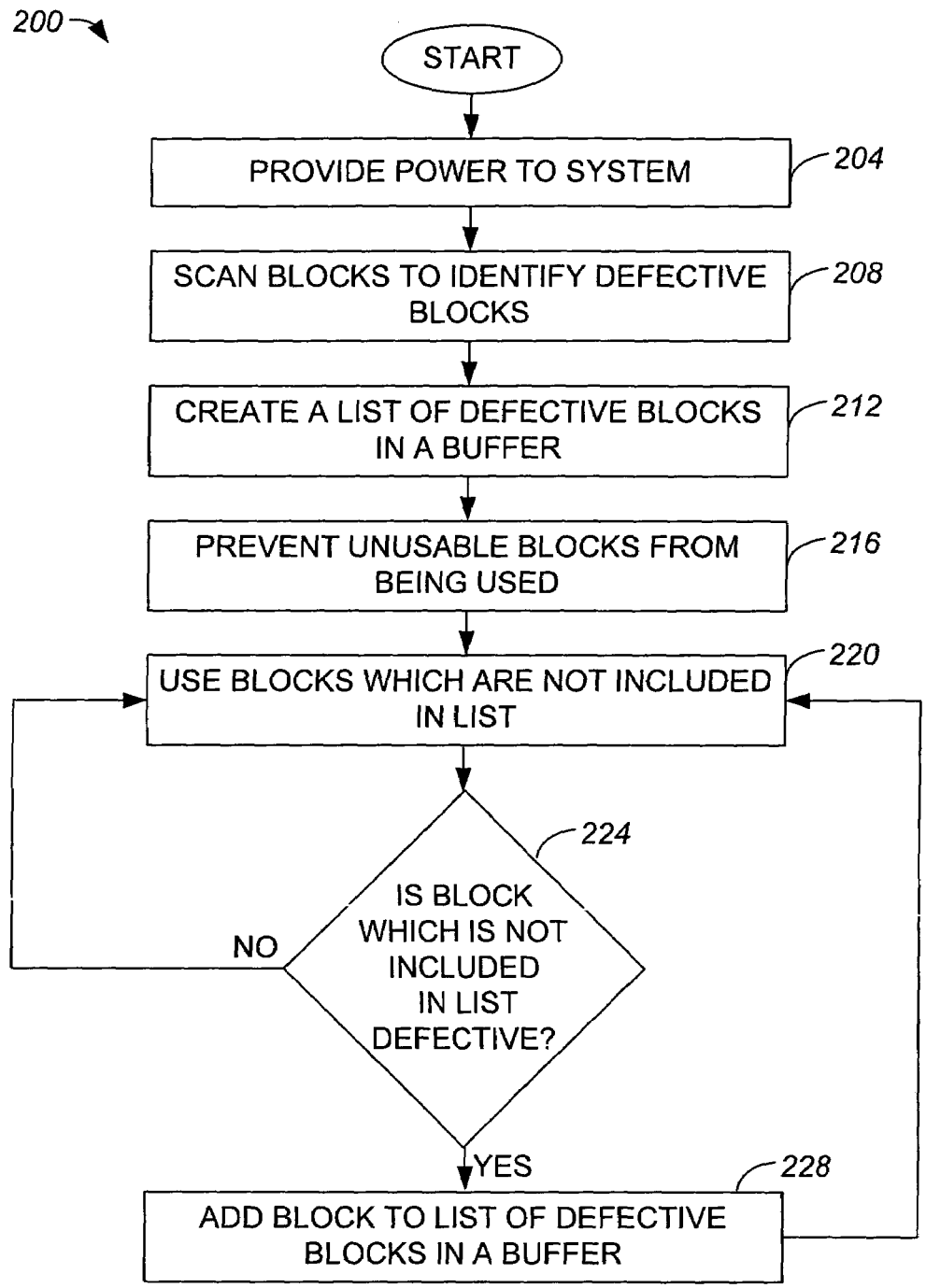
FIG. 1 is a process flow diagram which illustrates the steps associated with one conventional method of compiling a list of defective blocks within a memory system.
Figure 2A:
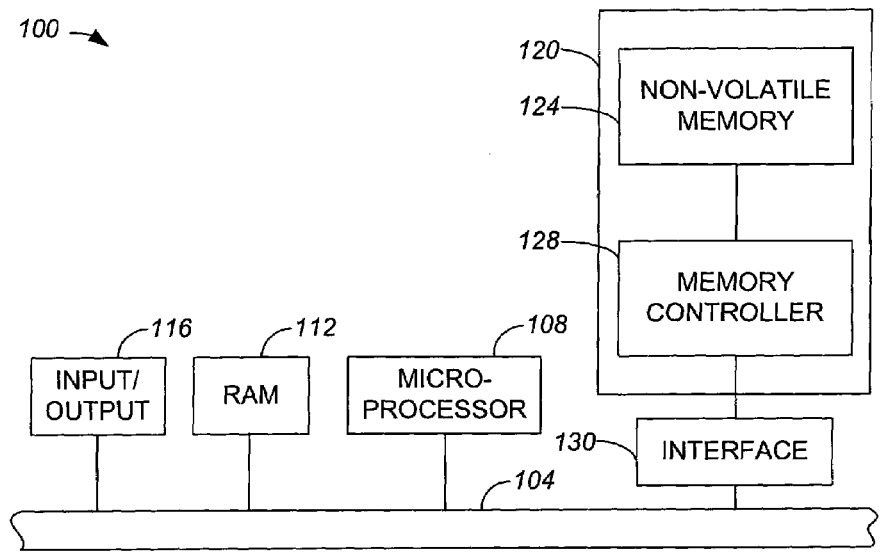
FIG. 2a is a diagrammatic representation of a general host system which includes a non-volatile memory.

Flash memory systems or, more generally, non-volatile memory devices which may benefit from the ability manage unusable blocks and to reclaim blocks which were previously identified as being unusable for use once additional spare blocks may be needed generally include flash memory, e.g., NAND or MLC NAND, cards and chip sets. Typically, flash memory systems are used in conjunction with a host system such that the host system may write data to or read data from the flash memory systems. However, some flash memory systems include embedded flash memory and software which executes on a host to substantially act as a controller for the embedded flash memory, as will be discussed below with respect to FIG. 2c. Referring to FIG. 2a, a general host system which includes a non-volatile memory device, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

Host system 100 may also be a system which either only captures data, or only retrieves data. That is, host system 100 may be, in one embodiment, a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional interface block 130 may allow non-volatile memory device 120 to interface indirectly with bus 104. When present, input/output circuit block 116 serves to reduce loading on bus 104, as will be understood by those skilled in the art. Non-volatile memory device 120 includes non-volatile memory 124 and an optional memory control system 128. In one embodiment, non-volatile memory device 120 may be implemented on a single chip or a die. Alternatively, non-volatile memory device 120 may be implemented on a multi-chip module, or on multiple discrete components which may form a chip set and may be used together as non-volatile memory device 120. One embodiment of non-volatile memory device 120 will be described below in more detail with respect to FIG. 2b.

Non-volatile memory 124, e.g., flash memory such as NAND flash memory or an MLC NAND flash memory, is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128 or, when memory control system 128 is not present, by software executed by microprocessor 108. The operation of non-volatile memory 124 may be managed such that the lifetime of non-volatile memory 124 is substantially maximized by essentially causing sections of non-volatile memory 124 to be worn out substantially equally.

Non-volatile memory device 120 has generally been described as including an optional memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Alternatively, the functionality of memory control system 128 may be provided by microprocessor 108, as for example in an embodiment in which non-volatile memory device 120 does not include memory controller 128, as discussed above.

Figure 2B:
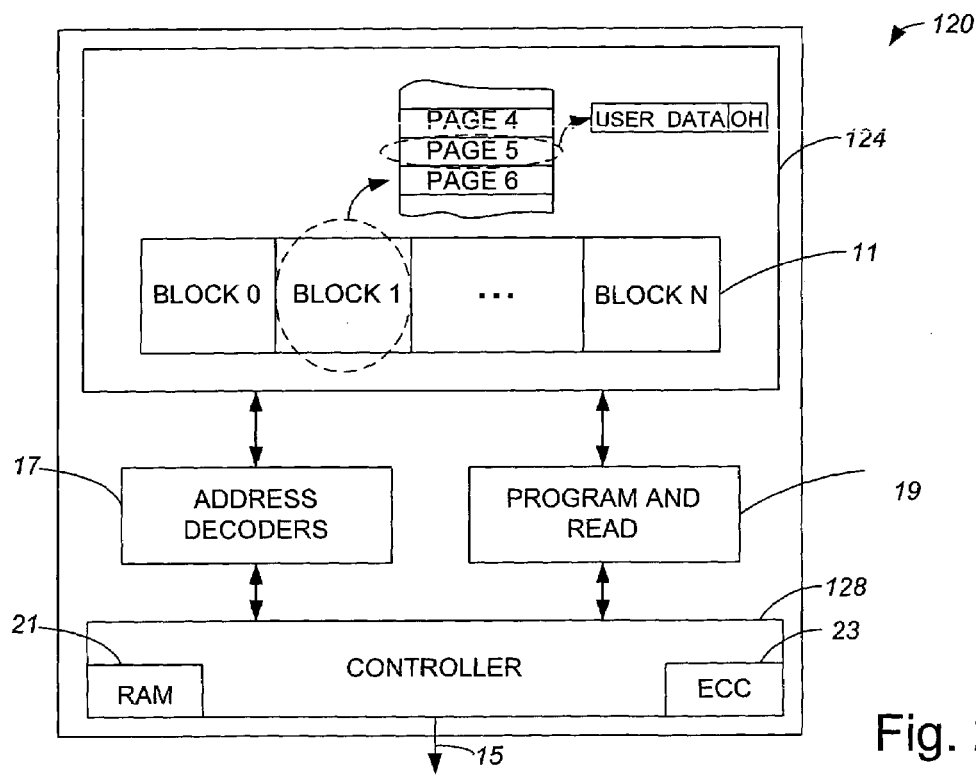

With reference to FIG. 2b, non-volatile memory device 120 will be described in more detail in accordance with an embodiment of the present invention. As described above, non-volatile memory device 120 includes non-volatile memory 124 and may include memory control system 128. Memory 124 and control system 128, or controller, may be primary components of non-volatile memory device 120, although when memory 124 is an embedded NAND device such as an embedded MLC NAND memory, for example, non-volatile memory device 120 may not include control system 128. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

When present, control system 128 communicates over a bus 15 to a host computer or other system that is using the memory system to store data. Bus 15 is generally a part of bus 104 of FIG. 2a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 or microprocessor 108 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0-N memory cells. As is common for flash EEPROM systems, the block is typically the smallest unit of erase. That is, each block contains the minimum number of memory cells that are erased together. Each block is typically divided into a number of pages. As will be appreciated by those skilled in the art, a page may be the smallest unit of programming. That is, a basic programming operation writes data into or reads data from a minimum of one page of memory cells. One or more sectors of data are typically stored within each page. As shown in FIG. 2b, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data, or redundant data, is typically an additional 16 bytes. One sector of data is most commonly included in each page but two or more sectors may instead form a page. Any number of pages may generally form a block. By way of example, a block may be formed from eight pages up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 2C:
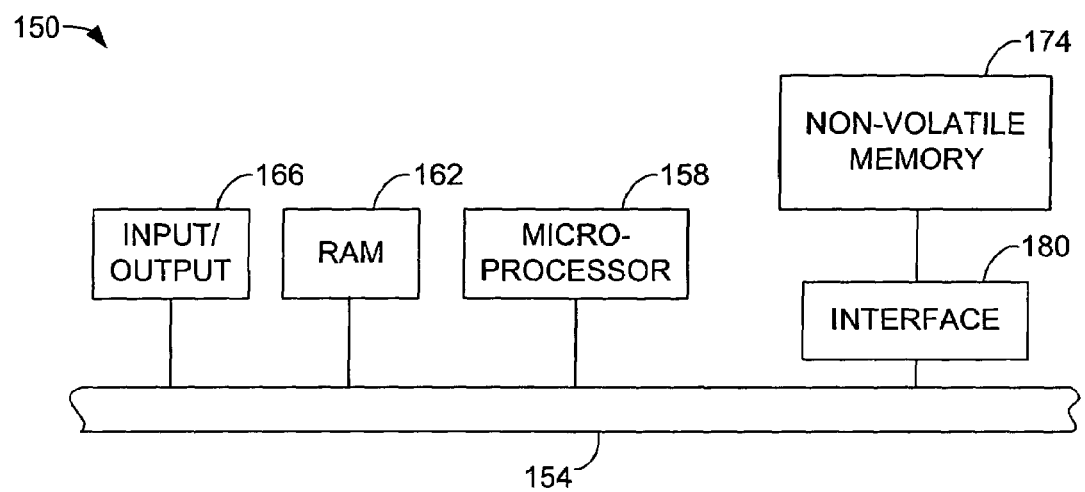
FIG. 2c is a diagrammatic representation of a host system which includes an embedded non-volatile memory.

In one embodiment, non-volatile memory such as an MLC NAND memory is embedded into a system, e.g., a host system. FIG. 2c is a diagrammatic representation of a host system which includes an embedded non-volatile memory. A host or computer system 150 generally includes a system bus 154 which allows a microprocessor 158, a RAM 162, and input/output circuits 166, among other components (not shown) of host system 150, to communicate. A non-volatile memory 174, e.g., a flash memory, allows information to be stored within host system 150. An interface 180 may be provided between non-volatile memory 174 and bus 154 to enable information to be read from and written to non-volatile memory 174.

Non-volatile memory 174 may be managed by microprocessor 158 which effectively executes either or both software and firmware which is arranged to control non-volatile memory 174. That is, microprocessor 158 may run code devices, i.e., software code devices or firmware code devices, which allow non-volatile memory 174 to be controlled. Such code devices, which may be a flash memory packaged with CPU inside microprocessor 158, a separate flash ROM, or inside non-volatile memory 174, which will be described below, may enable physical blocks in non-volatile memory 174 to be addressed, and may enable information to be stored into, read from, and erased from the physical blocks.

In order to enable unusable blocks to be differentiated, e.g., such that unusable blocks with factory defects and unusable blocks with growing defects may be readily identified, a first series of bits may be used to identify unusable blocks with factory defects and a second series of bits may be used to identify unusable blocks with growing defects. The different series of bits, e.g., signatures or markings, may be arranged to substantially uniquely identify blocks with factory defects and blocks with growing defects.

Generally, signatures which identify blocks as having factory defects and signatures which identify blocks as having growing defects may be stored in a data structure associated with a non-volatile memory system. Such a data structure, which is preferably stored in a data structure within a non-volatile memory component such that the data structure remains in tact when the overall system is powered down, may include bits associated with substantially every physical block present in the memory component. The bits associated with physical blocks which are unusable may be the signatures which substantially uniquely identify the unusable blocks as either having factory defects or growing defects.

Figure 3A:
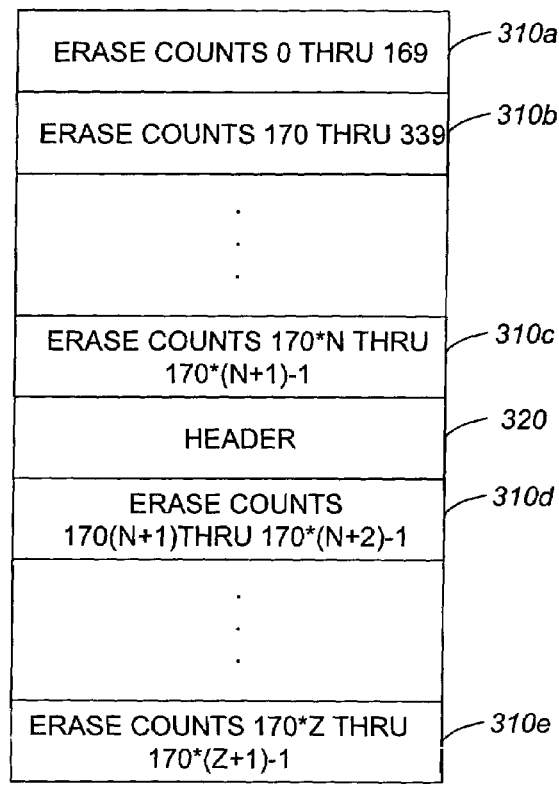
FIG. 3a is a diagrammatic representation of an erase count block in accordance with an embodiment of the present invention.

A data structure which may be used to store signatures or markings which identify unusable blocks with factory defects and unusable blocks with growing defects may be an erase count block, which is a reserved block that is stored in a memory, e.g., a NAND memory, associated with the non-volatile memory system, as described in U.S. patent application Ser. No. 10/281,626, which has been incorporated by reference. The erase count block may be accessed when a reclamation process is to occur in order to enable unusable blocks with growing defects, for instance, to be identified. Erase counts, which may be used to effectively track a number of times a physical block in a non-volatile memory system has been erased, may also be stored in an erase count block. In general, an erase count block may also contain an average erase count, which is arranged to be an indicator of an average number of times each usable physical block within a non-volatile memory system has been erased, in addition to the erase count of each physical block. FIG. 3a is a diagrammatic representation of an erase count block in accordance with an embodiment of the present invention. An erase count block 300 is generally sized such that erase count block 300 includes a certain number of bits for each block, i.e., physical block, within the overall non-volatile system which includes erase count block 300. The number of bits effectively allocated to each block may be chosen such that the entire erase count for a block may be accommodated by the allocated bits. In one embodiment, erase count block 300 may include approximately three bytes for each block, as three bytes are generally sufficient to accommodate erase counts on the order of approximately one hundred thousand. When three bytes are allocated for each block, in a 512 Mb system that includes approximately 2048 blocks with approximately 64 pages per block, erase count block 300 maybe sized to include approximately 12 pages, e.g., approximately six thousand bytes.

Erase count block 300 includes pages 310 which, as will be appreciated by those skilled in the art, often include approximately 512 bytes which may be used to store data such as erase counts. As shown, a first page 310a may be arranged to contain erase count entries for blocks '0' through '169,' while second page 310b may be arranged to contain erase count entries for blocks '170' through 339.' When an erase count for block '1,' i.e., physical block '1,' is to be written or read, bytes three through five of first page 310a may be accessed, as bytes three through five of first page 310a are arranged to contain an erase count entry which corresponds to block '1,' as will be described below with respect to FIGS. 3b and 3c.

Erase count block 300, in addition to including pages 310, also includes a header 320 which may generally be located substantially anywhere within erase count block 300. As shown, header 320 is located between pages 310c, 310d of erase count block 300, although it should be appreciated that header 320 is often located at a beginning of erase count block 300. Header 320, which will be discussed below with reference to FIG. 4, may be a page in erase count block 300 which includes information relating to the non-volatile flash memory which includes the blocks associated with the erase counts stored in pages 310.

Figure 3B:
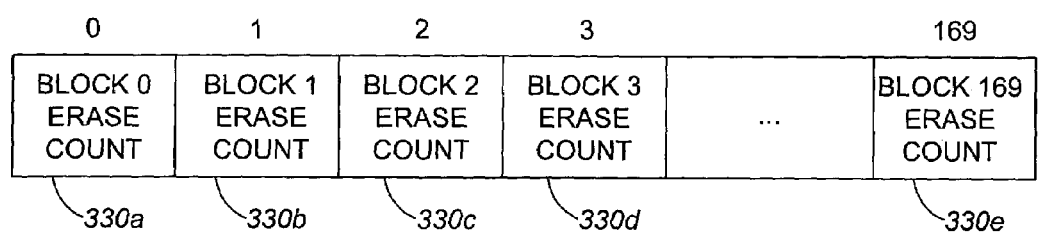
FIG. 3b is a diagrammatic representation of a page within an erase count block, e.g., page 310a of erase count block 300 of FIG. 3a, with the page divided substantially into locations in accordance with an embodiment of the present invention.

FIG. 3b is a diagrammatic representation of a page within an erase count block, e.g., page 310a of erase count block 300 of FIG. 3a, in accordance with an embodiment of the present invention. Page 310a is arranged to hold entries 330 which correspond to approximately one hundred and seventy physical blocks. As shown, entries 330 contain erase counts for blocks such that a first entry 330a in page 310a is arranged to contain an erase count for block '0,' and a second entry 330b is arranged to contain an erase count for block '1.' A final entry 330e in page 310a is arranged to hold an erase count for block '169.'

Figure 3C:
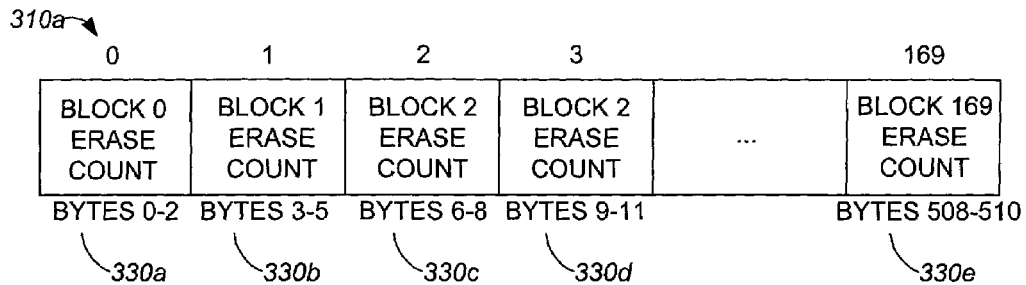
FIG. 3c is a diagrammatic representation of a page within an erase count block, e.g., page 310a of erase count block 300 of FIG. 3a, with the page divided substantially into bytes in accordance with an embodiment of the present invention.

Each entry 330 includes substantially the same number of bytes. As shown in FIG. 3c, entry 330a which corresponds to block '0' may be bytes zero through two in page 310a, while entry 330c which corresponds to block '2' may be bytes six through eight in page 310a. As previously mentioned, each entry 330 may include approximately three bytes, although it should be appreciated that the number of bytes in each entry 330 and, hence, the number of entries 330 in page 310a, may vary. By way of example, in one embodiment, each entry 330 may include approximately four bytes.

While each entry 330 in page 310a is arranged to contain an erase count, or an indication of a number of times a particular entry 330 has previously been erased, entries 330 may not necessarily contain an erase count. For instance, when a particular block is unusable and may not be written to or read from, e.g., due to a manufacturing or factory defect, that block will generally not have an erase count. As such, an erase count block such as erase count block 300 of FIG. 3a will generally not have an entry which contains an erase count for an unusable block. Instead, in lieu of holding erase counts, entries 330 for unusable blocks may hold indicators or markings which are arranged to identify blocks as being unusable. More specifically, entries 330 may hold indicators which identify blocks as either being unusable due to a factory or manufacturing defect, or unusable due to a growing defect.

Figure 3D:
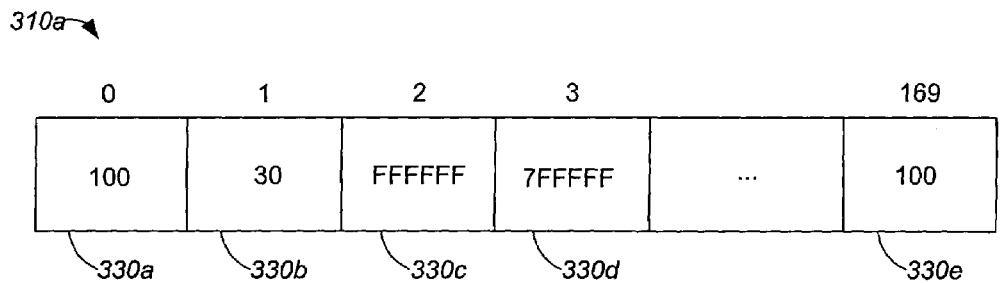
FIG. 3d is a diagrammatic representation of a page in an erase count block, e.g., page 310a of erase count block 300 of FIG. 3a, which contains erase counts and an entry which indicates that particular blocks are unusable in accordance with an embodiment of the present invention.

FIG. 3d is a diagrammatic representation of a page in an erase count block, e.g., page 310a of erase count block 300 of FIG. 3a, which contains erase counts and an entry which indicates that particular blocks are unusable in accordance with an embodiment of the present invention. When a block is usable, or may be written to or read from, the block will generally have an erase counts. For example, entry 330a of page 310a, which is arranged to contain an erase count that corresponds to block '0,' may contain a value of '100' when block '0' has been erased one hundred times. Similarly, entry 330b of page 310a may contain a value of '30' when block '1' has been erased thirty times.

If block '2' has been identified as being an unusable block due to a factory defect, as for example through a marking or a signature stored within block '2,' then entry 330c of page 310a, which corresponds to block '2' may contain a marking which is arranged to indicate that block '2' is not usable due to a factory defect. In the described embodiment, a marking or signature of 'FFFFFF' in entry 330c may indicate that block '2' is unusable due to a factory defect. It should be appreciated that substantially any marking may be used to indicate that a block is unusable due to a factory defect or manufacturing defect.

When block '3' has been identified as being an unusable block due to a growing defect or a defect other than a factory defect, then entry 330d of page 310a, which corresponds to block '3' may contain a marking which is arranged to indicate that block '3' is not usable due to a growing defect. As shown, a marking or signature of '7FFFFF' in entry 330d may indicate that block '3' is unusable due to a growing defect. Another example of signatures which may be used to identify that a block is unusable due to a growing defect is a signature such as '8XXXXX', where 'XXXXX' may be the approximately twenty bits of an erase count. Using a signature in which an erase count may be included in the marking of a growing defect may enable the erase count of a block identified as being defective to be maintained within the block.

Figure 4:
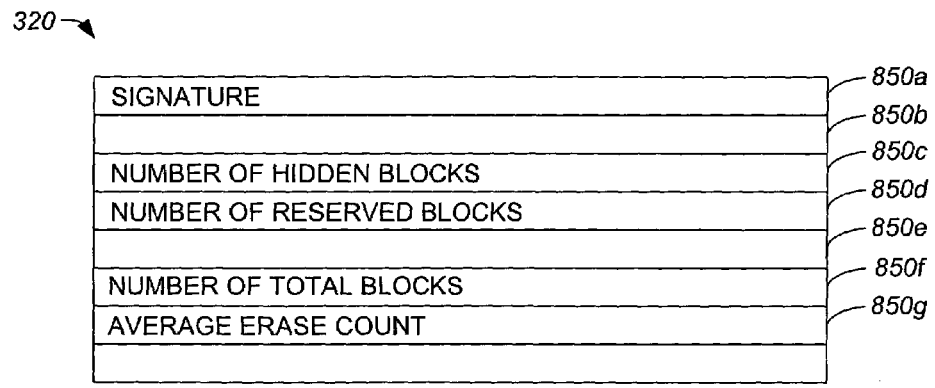
FIG. 4 is a diagrammatic representation of a header of an erase count block, e.g., header 320 of erase count block 300 of FIG. 3a, in accordance with an embodiment of the present invention.

As mentioned above, an erase count block such as erase count block 300 of FIG. 3a typically includes a header 320 which, in one embodiment, is a page within erase count block 300 which contains information that generally relates to the blocks within a non-volatile memory system. Referring next to FIG. 4, a header of an erase count block, e.g., header 320 of erase count block 300 of FIG. 3a, will be described in accordance with an embodiment of the present invention. Header 320, which may be located substantially anywhere within an erase count block, may include approximately 512 bytes which may be used to store information. The information stored in header 320 typically includes a signature 350a, which may be used for security checks. Information 350c which relates to the number of hidden blocks in a non-volatile memory may also be included in header 320, in addition to information 350d which relates to the number of reserved blocks 350d in the non-volatile memory. Information 350f may include a total number of blocks included in the non-volatile memory, and an average erase count is stored as information 350g in header 320.

It should be appreciated that header 320 may generally include other contents. By way of example, header 320 may include information pertaining to a total number of usable blocks which are either in use or available for use, as well as partitioning information. Alternatively, header 320 may maintain information relating to a number of blocks with factory defects and a number of blocks with growing defects.

Figure 5:
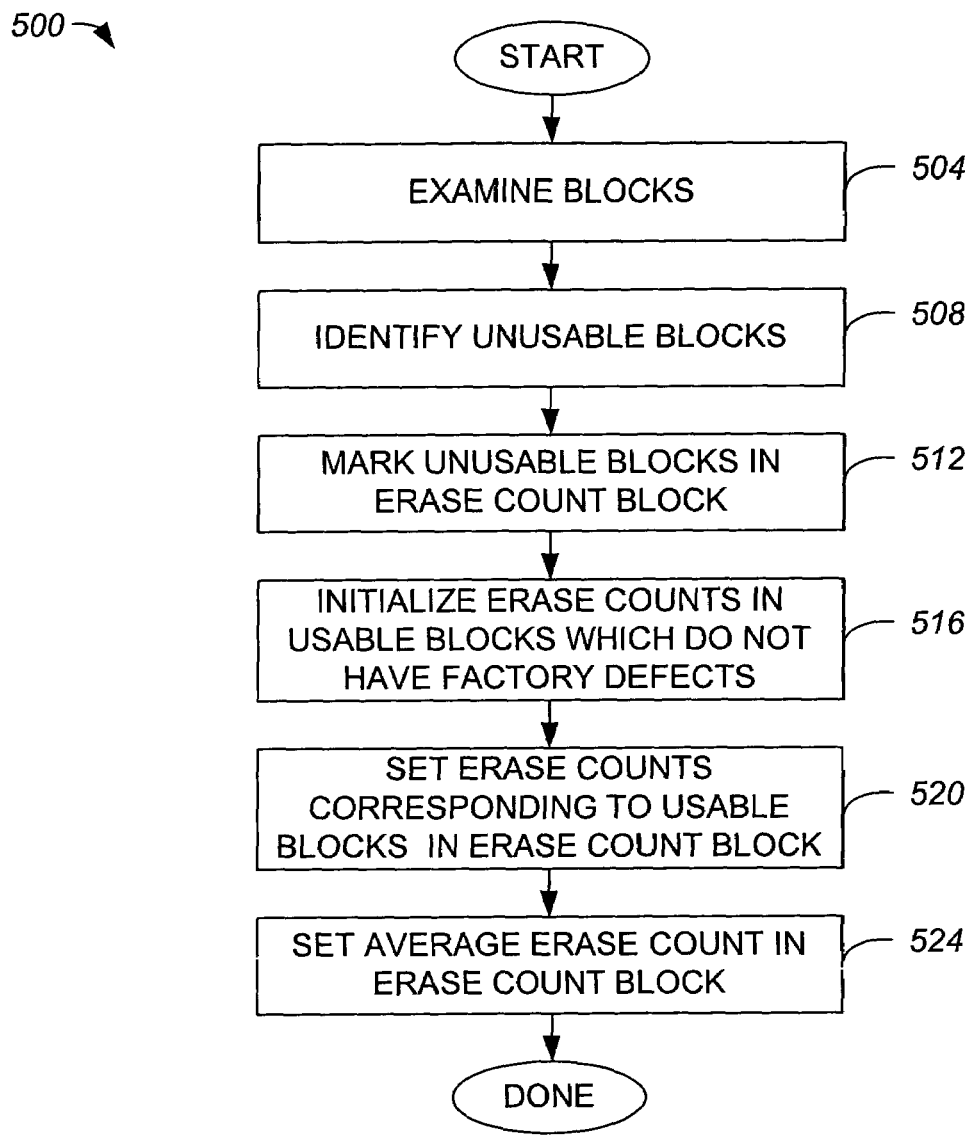
FIG. 5 is a process flow diagram which illustrates the steps associated with one method of initializing an erase count block when a non-volatile memory of a non-volatile memory system is first formatted in accordance with an embodiment of the present invention.

An erase count block is generally initialized, or otherwise created, when power is first provided to a non-volatile memory system which includes the erase count block. In other words, an erase count block is typically initialized when a non-volatile memory of a non-volatile memory system is first formatted, and any unusable blocks are identified. With reference to FIG. 5, the steps associated with one method of initializing an erase count block when a non-volatile memory of a non-volatile memory system is first formatted will be described in accordance with an embodiment of the present invention. A process 500 begins at step 504 in which all blocks or, more specifically, all physical blocks, within the non-volatile memory system are examined. A defect scanning process may, in one embodiment, include a defect scanning process at a low level format. Examining the blocks may include examining the contents of the blocks to determine which of the blocks may be unusable. Typically, when a system is first being formatted, unusable blocks include substantially only blocks identified by a manufacturer of the non-volatile memory as being unusable, i.e., blocks which have factory defects. Such blocks may be identified as having factory defects by bits stored within the blocks. Accordingly, in step 508, unusable blocks within the non-volatile memory are identified. Identifying the unusable blocks may involve identifying each block which contains bits or a marking, e.g., a particular signature such as '0' in predetermined page of the block, which is known to identify the block as having or otherwise including a factory defect.

Once substantially all unusable blocks are identified, the unusable blocks are marked or otherwise identified in the erase count block as being unusable in step 512. Marking a particular block as being unusable may include placing a particular marking or code in the portion of the erase count block that is reserved for the block that identifies the block as being unusable. A signature such as 'FFFFFF' may be placed in an appropriate section of the erase count block to indicate that a particular block is unusable due to a factory defect. It should be appreciated that marking unusable blocks in the erase count block typically also includes updating the header of the erase count block to include a count of the total number of unusable blocks within the non-volatile memory.

After the unusable blocks are marked in the erase count block, the erase counts of usable blocks, or blocks which do not have factory defects, which are not erased are initialized in step 516. Initializing the erase counts may include setting the erase count of each block which is erased to a value of zero. An erase count for a block which is not erased is typically stored in at least one of the redundant or overhead areas associated with the block. The erase counts corresponding to the usable blocks, both erased and unerased usable blocks, may then be set in the erase count block in step 520. Typically, an erase count stored in the erase count block may be set or otherwise initialized to a value of zero, or in the case of an unerased block, the same value as the erase count as stored in its corresponding unerased block. In other words, the erase count for an unerased block is generally the same as the erase count stored into the erase count block in a location which corresponds to the block. Once the erase counts are set as entries in the erase count block, then the average erase count may be set in step 524 in the erase count block. As previously discussed, the average erase count may be stored into the header of the erase count block. When the erase counts of the usable blocks are all initialized to a value of zero, then the average erase count may initially be set to a value of zero. The process of formatting a non-volatile memory included in a non-volatile memory system is completed after the average erase count is set.

Figure 6:
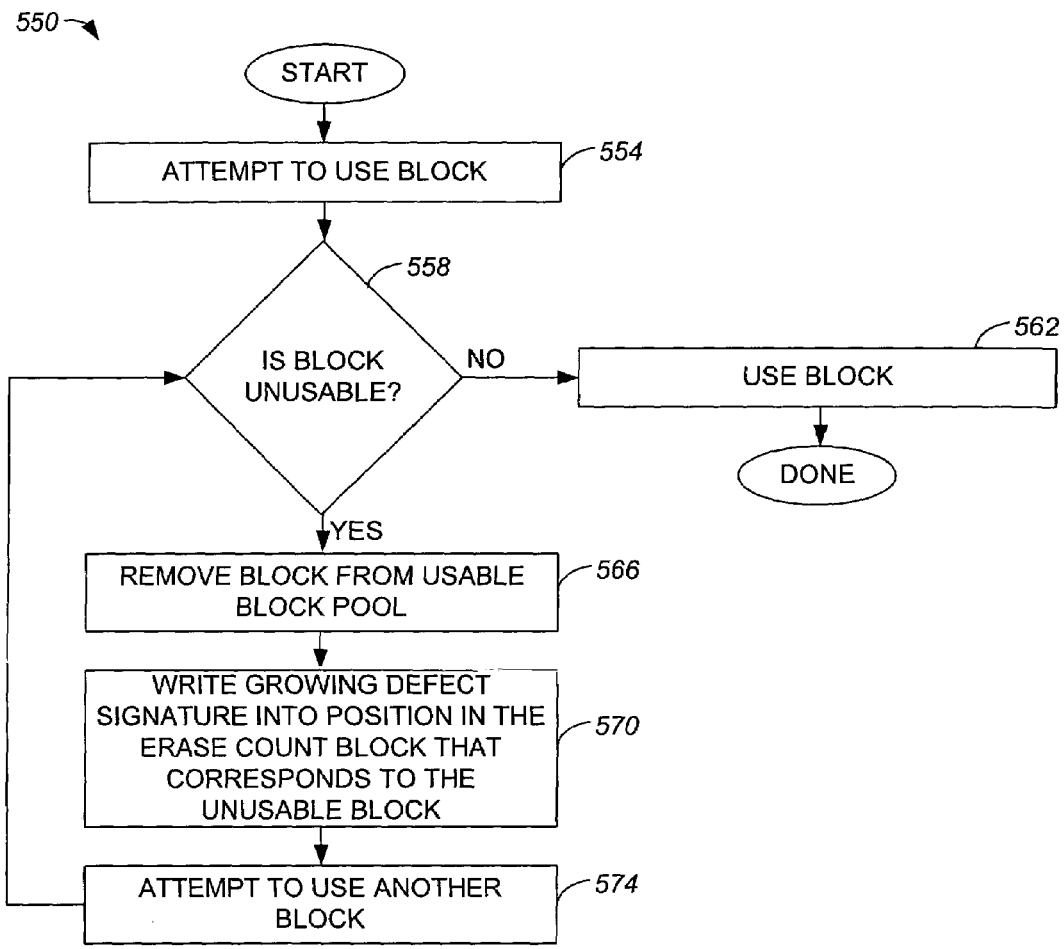
FIG. 6 is a process flow diagram which illustrates the steps associated with processing a block which may have a growing defect in accordance with an embodiment of the present invention.

During the course of using physical blocks within a non-volatile memory system, some blocks may be identified as having a growing defect. When a block which was previously usable is determined to no longer be usable, that block generally has a growing defect. With reference to FIG. 6, the steps associated with processing a block which may have a growing defect will be described in accordance with an embodiment of the present invention. A process 550 associated with effectively classifying a block begins at step 554 in which an attempt is made to use a block. In the described embodiment, attempting to use a block may include obtaining the block from a spare block pool and trying to write data into the block. Alternatively, attempting to use a block may also include trying to read data from the block or trying to erase the block.

A determination is made in step 558 as to whether the block is usable. In other words, it is determined whether the block has been successfully written to, successfully read from, or successfully erased. If it is determined that the block is not unusable, then the indication is that the block is a usable block and may remain in an overall pool of usable blocks. Accordingly, process flow proceeds to step 562 in which the block is used. Using the block may include using the block to store data and adding the block to a spare block pool. Once the block is used and effectively classified as being usable, the process of classifying the block is completed.

Alternatively, if it is determined in step 558 that the block is not usable, then in step 566, the block is effectively removed from an overall pool of usable blocks. For example, if the block was obtained from an spare block pool and the attempt to use the block in step 554 involved attempting to write to the block, the removing the block from the overall pool of usable blocks may include removing the block from the spare block pool. In general, removing the block from the overall pool of usable blocks may include marking the block to indicate that the block is not usable.

After the block is removed from the overall pool of usable blocks, a growing defect signature, e.g., a '7FFFFF' signature, may be written into an erase count block of the system in step 570 to indicate that the block has a growing defect. Such a signature is typically written into a position within the erase count block which corresponds to the block. Once the growing defect signature is written into the erase count block, an attempt may be made to use another block in step 574. For example, when the block marked as having a growing defect in step 570 was to be used to store data, then a different block may be obtained for use in storing the data that failed to be stored in the block marked as having a growing defect. When the attempt is made to use another block, process flow returns to step 558 in which it is determined if the block is unusable.

By essentially differentiating between unusable blocks with factory defects and unusable blocks with growing defects, as for example through the use of different signatures within an erase count block, it may be possible to reclaim at least some of the unusable blocks with growing defects. That is, by enabling blocks which have substantially always been bad, i.e., unusable blocks with factory defects, to be readily differentiated from blocks which were once good but became bad, i.e., unusable blocks with growing defects, it may be possible to reclaims at least some of the unusable blocks with growing defects when there is a need for additional blocks. Reclaiming unusable blocks generally involves performing relatively thorough testing on the unusable blocks to identify any blocks which may once again be usable.

Figure 7A:
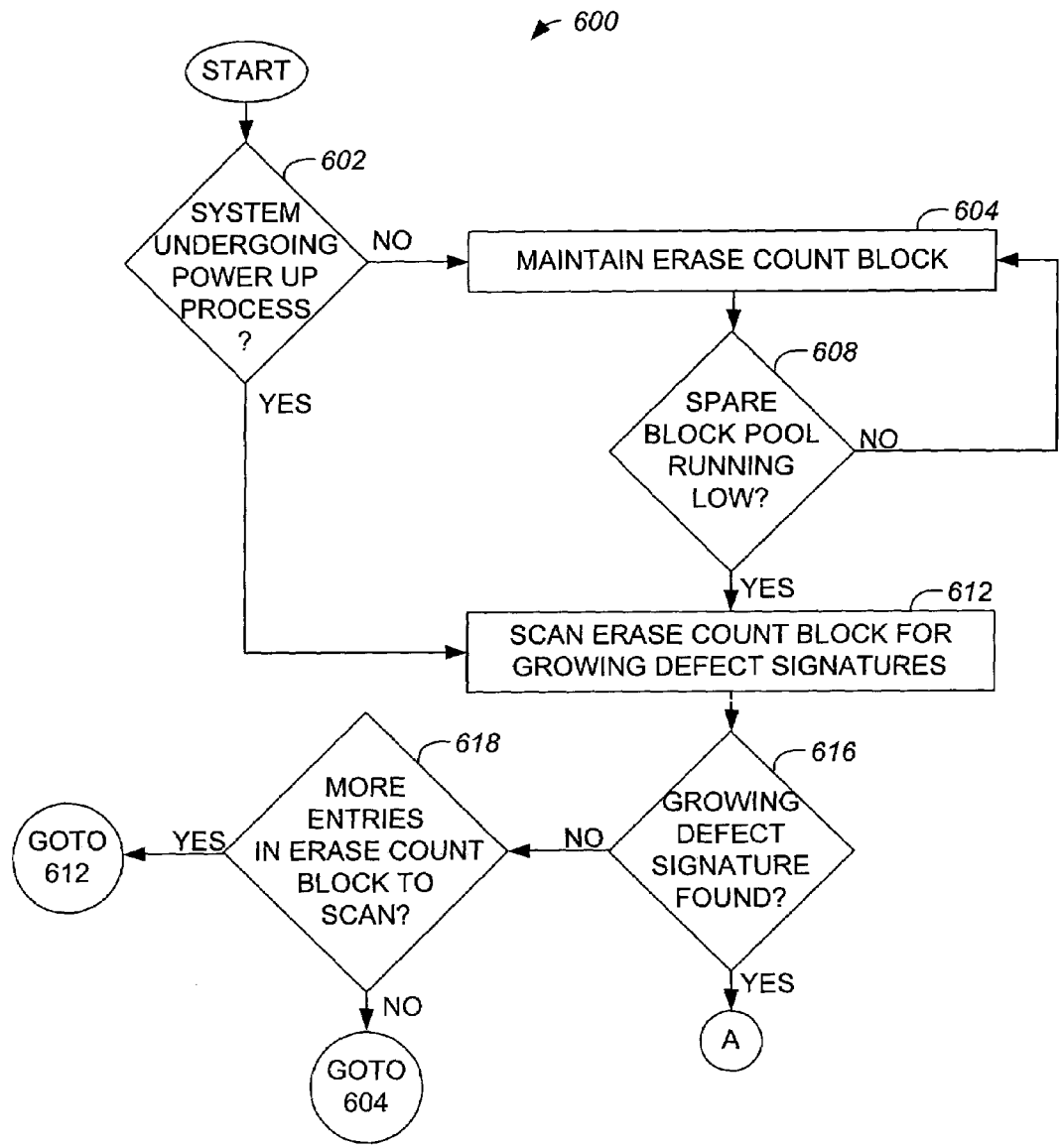
FIGS. 7a and 7b are a process flow diagram which illustrates the steps associated with one method of implementing a process of reclaiming unusable blocks within a non-volatile memory system in accordance with an embodiment of the present invention.
Figure 7B:
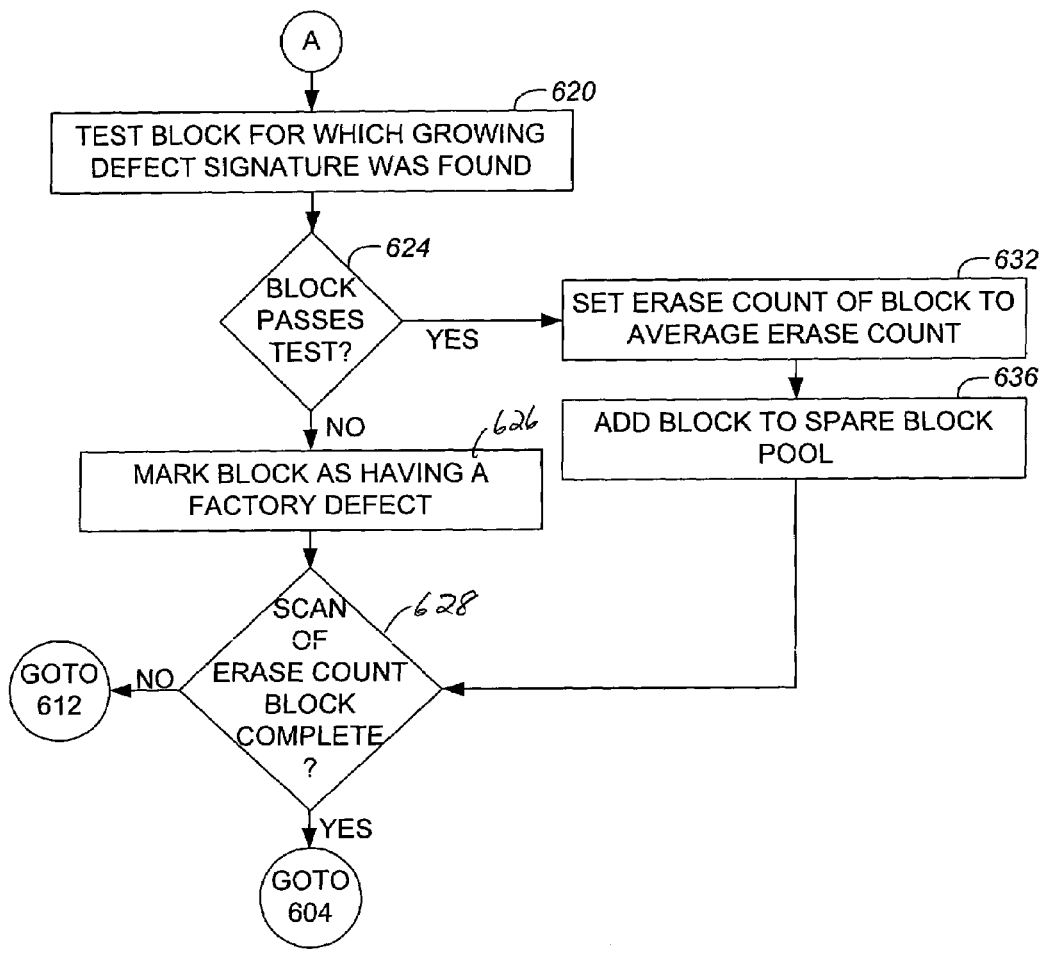

FIGS. 7a and 7b are a process flow diagram which illustrates the steps associated with one method of implementing a process of reclaiming unusable blocks within a non-volatile memory system in accordance with an embodiment of the present invention. A process 600 of operating an overall non-volatile system which allows unusable blocks to be reclaimed begins at step 602 in which it is determined if the memory system is in the process of being powered up. If it is determined that the system is not undergoing a power up process, process flow moves to step 604 in which an erase count block is maintained. Maintaining an erase count block may include writing signatures into the erase count block which identify unusable blocks which are unusable due to growing defects. Typically, the erase count block is maintained as blocks within the system are being used.

At some point during the operation of the system, it may be determined in step 608 when a spare block pool, or a pool of blocks which are generally available for use in storing data, is running low. That is, it is determined in step 608 if there are an adequate number of spare blocks which are available for use. If it is determined that the spare block pool is not running low, as for example by a controller or by a processor associated with the non-volatile memory system, the process flow returns to step 604 in which the erase count block continues to be maintained.

Alternatively, if it is determined in step 608 that the spare block pool is running low, then the indication is that it may be desirable to attempt to reclaim some unusable blocks with growing defects. In other words, it may be beneficial to determine if any blocks which are identified as having growing defects are, in fact, usable. Accordingly, process flow moves from step 608 to step 612 in which the erase count block is scanned for growing defect signatures. Once a scan of the erase count block has started, it is determined in step 616 whether a signature which identifies a growing defect has been found.

If the determination in step 616 is that a signature which identifies a growing defect has not been found, then a determination is made in step 618 as to whether there are more entries in the erase count block to scan for signatures which identify growing defects. When it is determined that there are more entries to scan, then the erase count block is scanned for signatures which identify growing defects in step 612. On the other hand, when it is determined that there are no more entries in the erase count block to scan, the process flow returns to step 604 in which the erase count block continues to be maintained.

Returning to step 616, if it is determined that a growing defect signature has been found, then the block for which the growing defect signature was found is tested in step 620. Testing the block may include subjecting the block to any one of or any combination of an erase test for erasing information or bits from the block, a write test for writing bits into the block, and a read test for reading information from the block. As will be appreciated by those skilled in the art, an erase test is generally used to determine if a block may be properly erased, a write test is generally used to determine if a block may be written to, and a read test is generally used to determine if a block may be read from. In general, however, substantially any relatively thorough test of the block with a rigorous pattern may be used.

Once the block for which a growing defect signature was found is tested, it is determined in step 624 whether the block passed the test. In one embodiment, determining whether the block passed the test may include determining if the block successfully underwent at least one of an erase process, a write process, and a read process. If it is determined that the block passed the test it was subjected to, then the indication is that the block is no longer unusable and, hence, may be reclaimed for use. Accordingly, process flow moves to step 632 in which the erase count of the block is set, e.g., to an average erase count associated with the overall system. After the erase count of the block is set, the block is added in step 636 to a spare block pool. Adding the block to the spare block pool enables the block to be obtained for use when needed.

From step 636, process flow proceeds to step 628 in which it is determined if the scan of the erase count block is complete. In other words, it is determined in step 628 whether there are additional entries in the erase count block to scan for signatures which identify blocks as having growing defects. If it is determined that there are additional entries to scan and, hence, that the scan of the erase count block is not complete, then process flow returns to step 612 in which the erase count block is scanned for signatures which identify blocks as having growing defects. Alternatively, if it is determined in step 628 that the scan of the erase count block is complete, then process flow returns to step 604 in which the erase count block continues to be maintained.

Returning to step 624, if it is determined that the block which was tested in step 620 did not pass the test, then the implication is that the block is still unusable. As such, the block may not be reclaimed. In one embodiment, the block may be considered to effectively be permanently unusable. When the block does not pass the test in step 624, the block is determined to still be unusable, and process flow proceeds to step 626 in which the block is marked as having a factory defect in step 626. It should be appreciated that marking the block as having a factory defect typically includes writing a factory defect signature for the block in to the erase count block. After the block is marked as having a factory defect, it is determined whether the scan of the erase count block is complete in step 628.

Referring back to step 602, when it is determined that the system is undergoing a power up process, then in one embodiment, unusable blocks with growing defects may be tested to determine if such blocks are in fact usable. Accordingly, from step 602, process flow moves to step 612 in which the erase count block is scanned for growing defect signatures.

Figure 8:
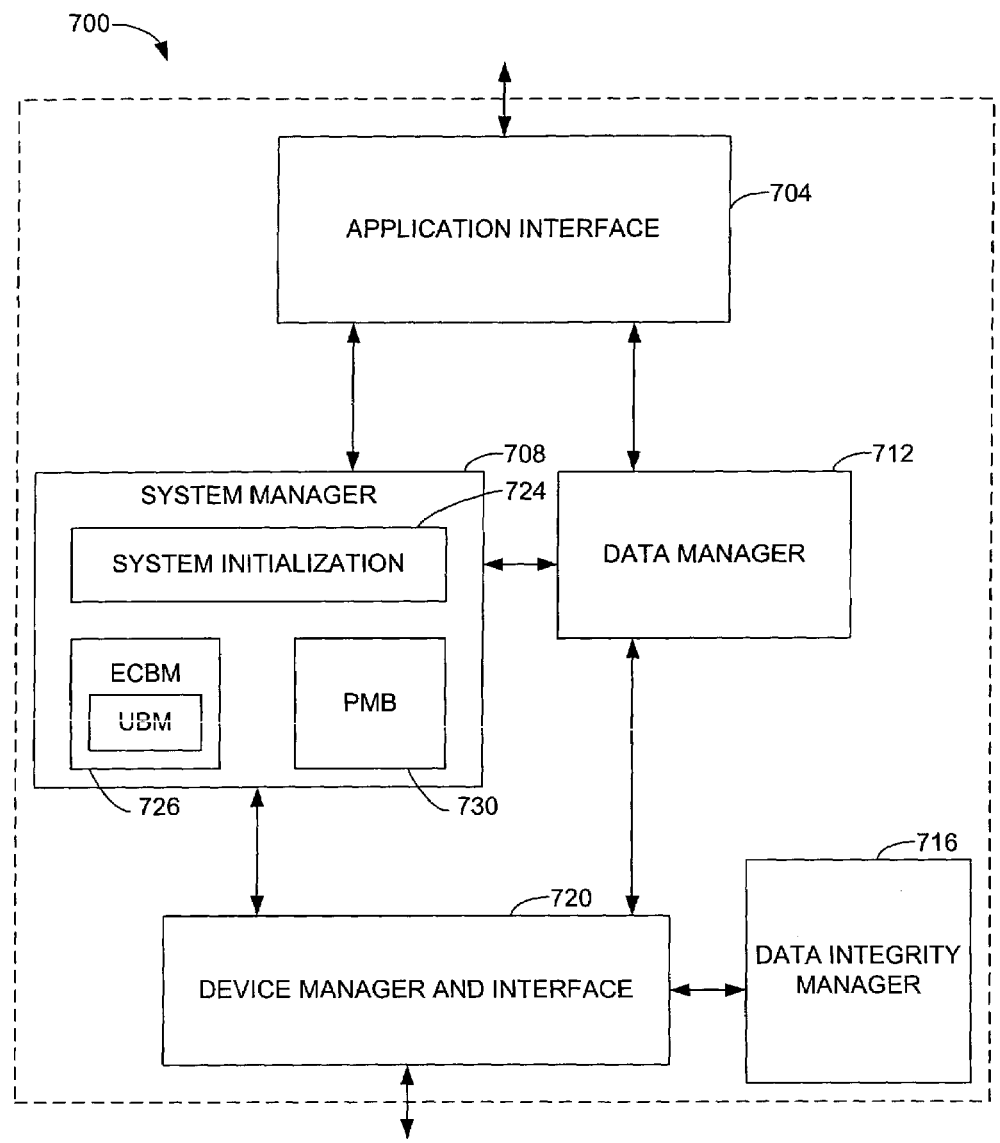
FIG. 8 is a diagrammatic block diagram representation of a system architecture in accordance with an embodiment of the present invention.

The functionality associated with managing unusable blocks is typically provided in software, e.g., as program code devices, or as firmware to a host system which includes a non-volatile memory or non-volatile memory component. One embodiment of a suitable system architecture associated with the software or firmware provided to a host system to enable unusable blocks to effectively be tracked using signatures in an erase count block, and to enable blocks with growing defects to potentially be reclaimed, is shown in FIG. 8. A system architecture 700 generally includes a variety of modules which may include, but are not limited to, an application interface module 704, a system manager module 708, a data manager module 712, a data integrity manager 716, and a device manager and interface module 720. In general, system architecture 700 may be implemented using software code devices or firmware which may be accessed by a processor, e.g., processor 108 of FIG. 2a.

In general, application interface module 704 may be arranged to communicate with a host, an operating system, or a user directly. Application interface module 704 is also in communication with system manager module 708 and data manager module 712. When a user makes a request to read, write, or format the flash memory, the user generally sends requests to the operating system, which then passes the requests to application interface module 704. Application interface module 704 directs the requests to system manager module 708 or data manager module 712 depending on the requests.

System manager module 708 includes a system initialization submodule 724, an erase count block management submodule 726, and a power management block submodule 730. System initialization submodule 724 is generally arranged to enable an initialization request to be processed, and typically communicates with erase count block management submodule 726.

Erase count block management submodule 726 includes functionality to cause erase counts of blocks to be stored, and functionality to cause an average erase count to be calculated, as well as updated, using individual erase counts. In other words, erase count block management submodule 726 effectively allows erase counts to be cataloged and allows an average erase count to be maintained. Further, in one embodiment, erase count block management submodule 726 also substantially synchronizes the erase count of substantially all blocks in an erase count block during a initialization request of an overall system. While erase count block management submodule 726 may be arranged to cause an average erase count to be stored in an erase count block, it should be appreciated that power management block submodule 730 may instead be used to enable the average erase count to be stored.

In addition to being in communication with application interface module 704, system manager module 708 is also in communication with data manager module 712, as well as device manager and interface module 720. Data manager module 712, which communicates with both system manager module 708 and application interface module 704, may include functionality to provide sector mapping which effectively translates logical sectors into physical sectors. That is, data manager module 712 is arranged to map logical blocks into physical blocks. Data manager module 712 may also include functionality associated with operating system and file system interface layers, and enables groups within blocks to be managed, as described in co-pending U.S. patent application Ser. No. 10/281,855, which is incorporated herein by reference in its entirety. In one embodiment, data manager module 712 may be arranged to enable a substantially out-of-sequence write process to occur.

Device manager and interface module 720, which is in communication with system manager module 708, data manager 712, and data integrity manager 716, typically provides a flash memory interface, and includes functionality associated with hardware abstractions, e.g., an I/O interface. Data integrity manager module 716 provides ECC handling, among other functions.

Although only a few embodiments of the present invention have been described, it should be understood that the present invention may be embodied in many other specific forms without departing from the spirit or the scope of the present invention. By way of example, although unusable blocks with growing defects and unusable blocks with factory defects have been described as being tracked using different signatures in an erase count block, different types of unusable blocks may be tracked using substantially any suitable data structure. In other words, in lieu of tracking blocks with growing defects using one type of marking or signature and blocks with factory defects using another type of marking or signature within an erase count block, such blocks may be tracked in various data structures including, but not limited to, a data structure which is arranged to substantially exclusively contain information relating to unusable blocks. Within such a data structure, blocks with growing defects may be identified and blocks with factory defects may be identified such that it may be possible to readily identify the blocks with growing defects for reclamation purposes.

In general, substantially any marking or signature may be used to identify the type of defect that is present in a block. That is, although a signature of '7FFFFF' has been described as being suitable for use in identifying a block as having a growing defect and a signature of 'FFFFFF' has been identified as being suitable for use in identifying a block as having a factory defect, the signatures may vary widely.

The contents of a header of an erase count block may vary widely without departing from the spirit or the scope of the present invention. For instance, a total number of unusable blocks may not necessarily be stored in the header and, instead, either no information pertaining to a number of unusable blocks may be stored, or a number of unusable blocks with growing defects and a number of unusable blocks with factory defects may be stored separately. Alternatively, partitioning information may be substantially eliminated from the header.

While the recycling or reclamation of unusable blocks has been described in terms of testing substantially only unusable blocks with growing defects to determine if any unusable blocks with growing defects may be reclaimed, substantially all unusable blocks may instead be tested to determine if there are any unusable blocks which may be suitable for reclamation. In an embodiment in which substantially all unusable blocks are tested, signatures stored in an erase count block to identify unusable blocks may be the same for both blocks with growing defects and blocks with factory defects. That is, in a system which enables unusable blocks to be reclaimed, signatures in the erase count block may not necessarily differentiate between the types of defects associated with an unusable block and may, instead, identify substantially only that a block is unusable.

The steps associated with the various methods of the present invention may be widely varied. In general, steps may be added, removed, reordered, and altered without departing from the spirit or the scope of the present invention. By way of example, instead of attempting to reclaim blocks with growing defects when a spare block pool is running low, blocks may be reclaimed substantially any time. In addition, the processing of a block which may have a growing defect may include copying or at least attempting to copy any contents of a block into another block upon a determination that the block with the contents has a growing defect. Therefore, the present examples are to be considered as illustrative and not restrictive, and the invention is not to be limited to the details given herein, but may be modified within the scope of the appended claims.

What is claimed is:

1. A method for identifying spare blocks within a non-volatile memory, the method comprising:
   subjecting at least one physical block identified as being defective within the non-volatile memory to a test, the test being arranged to determine if a defective physical block is usable;
   determining when the physical block identified as being defective passes the test; and
   identifying the physical block identified as being defective as a usable physical block when it is determined that the physical block identified as being defective passes the test.

2. The method of claim 1 wherein subjecting the at least one physical block identified as being defective to the test includes at least one of subjecting the at least one physical block identified as being defective to a write process to write bits into the physical block identified as being defective, a read process to read the bits from the physical block identified as being defective, and an erase process to erase the bits from the physical block identified as being defective.

3. The method of claim 1 wherein identifying the physical block as a usable physical block includes:
   identifying the physical block identified as being defective as a first spare block; and
   adding the first spare block to a pool of spare blocks associated with the non-volatile memory,
   wherein the first spare block is arranged to be obtained from the pool of spare blocks for use in storing bits.

4. The method of claim 1 further including:
   determining when at least one additional spare block is needed within the non-volatile memory; and
   identifying the physical block identified as being defective when it is determined that the at least one additional spare block is needed.

5. The method of claim 4 wherein identifying the physical block identified as being defective includes:
   scanning a data structure associated with the non-volatile memory,
   wherein the data structure is arranged to include bits arranged to indicate that the physical block identified as being defective is defective.

6. The method of claim 5 wherein the data structure is further arranged to include one of a first set of bits to identify when the physical block identified as being defective has a factory defect and a second set of bits to identify when the physical block identified as being defective has a growing defect.

7. The method of claim 4 wherein the data structure is an erase count block.

8. The method of claim 1 wherein the physical block identified as being defective includes a growing defect.

9. The method of claim 1 wherein the non-volatile memory is a flash memory.

10. The method of claim 9 wherein the flash memory is one of a NAND flash memory and an MLC NAND flash memory.

11. A method of managing unusable physical storage elements within a non-volatile memory, the method comprising:
   determining whether a first physical storage element is identified as being defective;
   removing the first physical storage element from a pool of usable physical storage elements responsive to determining that the first physical storage element is defective; and storing a first signature into a data structure in the non-volatile memory, the first signature being arranged to identify the first physical storage element as being defective.

12. The method of claim 11 wherein determining whether the first physical storage element is defective includes at least one of determining whether the first physical storage element may not be successfully read from, determining whether the first physical storage element may not be successfully written to, and determining whether the first physical storage element may not be successfully erased.

13. The method of claim 12 wherein responsive to determining that the first physical storage element is defective, the first physical storage element includes a growing defect, and the first signature is arranged to identify the first physical storage element as having the growing defect.

14. The method of claim 11 wherein determining whether the first physical storage element is defective includes reading bits included in the first physical storage element to determine if the bits are arranged to indicate that the first physical storage is defective.

15. The method of claim 14 wherein responsive to determining that the first physical storage element is defective, the first physical storage element includes a factory defect, and the first signature is arranged to identify the first physical storage element as having the factory defect.

16. The method of claim 11 wherein the data structure is further arranged to contain bits associated with the usable storage elements.

17. The method of claim 11 further including: scanning substantially all physical elements within the non-volatile memory to identify the first physical element.

18. The method of claim 11 wherein the first physical element is a first physical block, and the usable physical elements are usable physical blocks.

19. The method of claim 11 wherein the non-volatile memory is a flash memory.

20. The method of claim 19 wherein the flash memory is one of a NAND flash memory and an MLC NAND flash memory.

21. A non-volatile memory system comprising:
code devices that cause at least one physical block identified as being defective associated with a non-volatile memory to undergo a test, the test being arranged to determine if a physical block identified as being defective is usable;
code devices that cause a determination to be made regarding when the physical block identified as being defective passes the test;
code devices that cause the physical block identified as being defective to be identified as a usable physical block when it is determined that the physical block identified as being defective passes the test; and
a memory area that stores the code devices.

22. The non-volatile memory system of claim 21 wherein the code devices that cause the physical block identified as being defective to undergo the test include at least one of code devices that cause the physical block identified as being defective to undergo a write process to write bits into the physical block identified as being defective, code devices that cause the physical block identified as being defective to undergo a read process to read the bits from the physical block identified as being defective, and code devices that cause the defective physical block identified as being defective to undergo an erase process to erase the bits.

23. The non-volatile memory system of claim 21 wherein the code devices that cause the physical block identified as being defective to be identified as a usable physical block includes:
code devices that cause the physical block identified as being defective to be identified as a first spare block; and
code devices that cause the first spare block to be added to a pool of spare blocks associated with the non-volatile memory,
wherein the first spare block is arranged to be obtained from the pool of spare blocks for use in storing bits.

24. The non-volatile memory system of claim 21 further including:
code devices that cause a determination of when at least one additional spare block is needed within the non-volatile memory; and
code devices that cause the physical block identified as being defective to be identified when it is determined that the at least one additional spare block is needed,
wherein the code devices that cause the physical block identified as being defective to be identified include coded devices that cause a data structure associated with the non-volatile memory to be scanned,
wherein the data structure is arranged to include bits arranged to indicate that the physical block identified as being defective is defective.

25. The non-volatile memory system of claim 24 wherein the data structure is further arranged to include one of a first set of bits to identify when the physical block identified as being defective has a factory defect and a second set of bits to identify when the physical block identified as being defective has a growing defect.

26. The non-volatile memory system of claim 21 wherein the physical block identified as being defective includes a growing defect.

27. The non-volatile memory system of claim 21 wherein the code devices are one of software code devices and firmware code devices.

28. A non-volatile memory system comprising:
code devices that cause a determination to be made regarding whether a first physical storage element of a non-volatile memory is defective;
code devices that cause the first physical storage element to be removed from a pool of usable physical storage elements responsive to determining that the first physical storage element is defective;
code devices that cause a first signature to be stored into a data structure in the non-volatile memory, the first signature being arranged to identify the first physical storage element as being defective; and
a memory area that stores the code devices.

29. The non-volatile memory system of claim 28 wherein the code devices that cause the determination of when the first physical storage element is defective include at least one of code devices that cause a determination of whether the first physical storage element may not be successfully read from, code devices that cause a determination of whether the first physical storage element may not be successfully written to, and code devices that cause a determination of whether the first physical storage element may not be successfully erased.

30. The non-volatile memory system of claim 29 wherein responsive to determining that the first physical storage element is defective, the first physical storage element includes a growing defect, and the first signature is arranged to identify the first physical storage element as having the growing defect.

31. The non-volatile memory system of claim 28 wherein the code devices that cause the determination of whether the first physical storage element is defective include code devices that cause bits included in the first physical storage element to be read to determine if the bits are arranged to indicate that the first physical storage is defective.

32. The non-volatile memory system of claim 31 wherein responsive to determining that the first physical storage element is defective, the first physical storage element includes a factory defect, and the first signature is arranged to identify the first physical storage element as having the factory defect.

33. The non-volatile memory system of claim 28 further including:
code devices that cause substantially all physical elements within the non-volatile memory to be scanned to identify the first physical element.

34. The non-volatile memory system of claim 28 wherein the first physical element is a first physical block, and the usable physical elements are usable physical blocks.

35. The non-volatile memory system of claim 28 wherein the code devices are one of software code devices and firmware code devices.

36. A non-volatile memory system comprising:
a non-volatile memory;
means for subjecting at least one defective physical block associated with the non-volatile memory to a test, the test being arranged to determine if a defective physical block is usable;
means for determining when the defective physical block passes the test; and
means for identifying the defective physical block as a usable physical block when it is determined that the defective physical block passes the test.

37. The non-volatile memory system of claim 1 wherein the defective physical block includes a growing defect.

38. The non-volatile memory system of claim 36 wherein the non-volatile memory is a flash memory.

39. The non-volatile memory system of claim 38 wherein the flash memory is one of a NAND flash memory and an MLC NAND flash memory.

40. A non-volatile memory system comprising:
a non-volatile memory;
means for determining whether a first physical storage element is defective;
means for removing the first physical storage element from a pool of usable physical storage elements responsive to determining that the first physical storage element is defective; and
means for storing a first signature into a data structure in the non-volatile memory, the first signature being arranged to identify the first physical storage element as being defective.

41. The non-volatile memory system of claim 40 wherein the means for determining whether the first physical storage element is defective include at least one of means for determining whether the first physical storage element may not be successfully read from, means for determining whether the first physical storage element may not be successfully written to, and means for determining whether the first physical storage element may not be successfully erased.

42. The non-volatile memory system of claim 41 wherein responsive to determining that the first physical storage element is defective, the first physical storage element includes a growing defect, and the first signature is arranged to identify the first physical storage element as having the growing defect.

43. The non-volatile memory system of claim 40 wherein the means for determining whether the first physical storage element is defective include means for reading bits included in the first physical storage element to determine if the bits are arranged to indicate that the first physical storage is defective.

44. The non-volatile memory system of claim 43 wherein responsive to determining that the first physical storage element is defective, the first physical storage element includes a factory defect, and the first signature is arranged to identify the first physical storage element as having the factory defect.

45. The non-volatile memory system of claim 40 wherein the first physical element is a first physical block, and the usable physical elements are usable physical blocks.

46. The non-volatile memory system of claim 40 wherein the non-volatile memory is a flash memory.

47. The non-volatile memory system of claim 46 wherein the flash memory is one of a NAND flash memory and an MLC NAND flash memory.

48. A method for managing blocks within a non-volatile memory system, the method comprising:
determining whether a first physical block within a non-volatile memory of the non-volatile memory system has a factory defect;
storing a first signature in a data structure associated with the non-volatile memory which identifies the first physical block as having the factory defect responsive to determining that the first physical block has the factory defect;
preventing the first physical block from being used to store information responsive to determining that the first physical block has the factory defect;
determining whether a second physical block within the non-volatile memory has a growing defect;
storing a second signature in the data structure which identifies the second physical block as having the growing defect responsive to determining that the second physical block has the growing defect; and
preventing the second physical block from being used to store information responsive to determining that the first physical block has the growing defect.

49. The method of claim 48 further including:
determining whether a spare block is needed within the non-volatile memory;
testing the second physical block to determine if the second physical block is usable; and
designating the second physical block as the spare block responsive to determining that the second physical block is usable.

50. The method of claim 49 further including:
scanning the data structure to identify the second physical block by locating the second signature.

51. The method of claim 48 wherein the non-volatile memory is one of a NAND flash memory and an MLC NAND flash memory.

* * * * *